United States Patent [19]
Bhatt et al.

[11] Patent Number: 4,579,772
[45] Date of Patent: Apr. 1, 1986

[54] GLASS CLOTH FOR PRINTED CIRCUITS AND METHOD OF MANUFACTURE WHEREIN YARNS HAVE A SUBSTANTIALLY ELLIPTICAL CROSS-SECTION

[75] Inventors: Anilkumar C. Bhatt, Endicott; Michael J. Cibulsky, Binghamton, both of N.Y.; Donald E. Doran, New Milford, Pa.; Lawrence J. Hugaboom, Nichols; James W. Knight, Endicott, both of N.Y.

[73] Assignee: International Business Machines Corporation, Armonk, N.Y.

[21] Appl. No.: 562,664

[22] Filed: Dec. 19, 1983

[51] Int. Cl.[4] .......................... B32B 17/02; B32B 17/04
[52] U.S. Cl. .................................. 428/229; 139/420 C; 428/273; 428/397; 428/901
[58] Field of Search ............... 428/229, 397, 901, 273; 139/420 C

[56] References Cited

U.S. PATENT DOCUMENTS

| 3,085,027 | 4/1963 | Porteous | 428/229 |
| 3,461,025 | 8/1969 | Coleman et al. | 428/229 |
| 3,579,409 | 5/1971 | Shannon | 428/397 |
| 4,428,995 | 1/1984 | Yokono et al. | 428/901 |
| 4,461,855 | 7/1984 | Phillips | 428/367 |
| 4,513,055 | 4/1985 | Leibowitz | 428/901 |

FOREIGN PATENT DOCUMENTS 679359  2/1964  Canada .............................. 428/397

OTHER PUBLICATIONS

OTS Bulletin, OTS 63-189, 3/18/63, U.S. Dept. of Commerce.

Primary Examiner—James C. Cannon
Attorney, Agent, or Firm—David L. Adour; Kenneth P. Johnson

[57] ABSTRACT

Woven glass cloth and method of its manufacture suitable for use as a resin-impregnated substrate for printed circuits in which the major dimension or transverse axis of the elliptical warp yarns exceeds a predetermined fraction of that dimension of the fill yarns of the woven cloth. Multi-filament warp yarns are typically subjected to tensile stress during weaving and firing such that the yarn compaction prevents the thorough impregnation by a resin. The result is that voids are maintained along the innermost filaments of the yarn. These voids, when filled with materials other than resin, such as plating solution, ultimately produce circuit failures.

6 Claims, 4 Drawing Figures

GLASS CLOTH FOR PRINTED CIRCUITS AND METHOD OF MANUFACTURE WHEREIN YARNS HAVE A SUBSTANTIALLY ELLIPTICAL CROSS-SECTION

BACKGROUND OF THE INVENTION

This invention relates generally to laminates for printed circuits and more specifically to the woven glass fabric used as a reinforcing filler in such laminates.

Cloth woven of warp and fill yarns composed of fine, twisted glass filaments is widely used as reinforcement and substrate filler material for printed circuits. The cloth is typically impregnated in a treater with a liquid resin of organic polymer such as epoxy, then partially polymerized or semicured by heat to an easily handled material known as prepreg. It is laminated with other prepreg sheets or metal foil to full polymerization or final cure under heat and pressure. The foil is etched to form circuits and multiple sets of laminate can be joined. Thereafter, holes are drilled for circuit vias from one surface of the laminate to the other to connect circuit lines on the opposite panel surfaces.

The via or through hole walls are plated with conductive material that is usually copper to provide electrical continuity. For the plating process, the newly-drilled holes are cleaned with a liquid, seeded with a plating accelerator in a bath, then metal-plated by immersion in an electroless plating solution. After these circuitized substrates have been in service varying lengths of time, failures frequently have occurred as short circuits.

Analysis of these failures has revealed that metal, usually copper, has plated onto the interior of the glass yarns along the filament surfaces extending from the hole walls, eventually contacting a nearby voltage or ground plane or another hole wall. The spontaneously plated metal has resulted from plating solution being trapped in voids along the glass filaments of the warp yarn and subjected to applied voltage differentials. The solution became trapped in the voids from the time the hole walls were initially immersed in plating solution. After plating had been completed, the plating solution had been unable to drain from the filament voids. The voids generally were elongated and occurred near the centers of the warp yarns. This indicates that the glass yarns were not wholly or entirely impregnated with resin so that voids existed among the bunched filaments forming those yarns. Such voids occurred only infrequently within the orthogonal fill or weft yarns.

A subsequent finishing step for the cloth in the manufacturing process is that of removing filament lubricant coatings. The fabric is subjected to high temperature that has the ancillary effect of further tending to fix the cross sectional dimensions of the yarn and prevent later yarn relaxation or expansion.

The difficulty of thoroughly impregnating the glass yarns has been noted in a paper by G. Wiedemann, H. Rothe, A. Hasse and R. Wiechmann entitled "Relations Between Properties of Wetting and Impregnation, Technology, and Application of FRP", Advanced Composition of Matter, Proceedings International Conference, 3rd, Volume 2, pages 1636-51, 1980. On pages 1641 and 1642, the authors describe the presence of capillary lines or hollow spaces among filaments, particularly in the warp yarns. Their investigation concluded that the thorough impregnation of yarns was hindered by gumming due to the coupling agents used for adherence and by the density of the packed filaments in the yarn requiring greater displacement of air.

OBJECTS AND SUMMARY OF THE INVENTION

Accordingly, a primary object of this invention is to provide a method of manufacturing impregnated woven glass cloth that eliminates voids among the plurality of glass filaments comprising the yarns.

Another object of this invention is to provide a substrate for printed circuits in which the yarns of the glass cloth of the substrate are more thoroughly impregnated with a resin resulting in fewer voids.

A still further object of this invention is to provide a method of weaving glass cloth for circuit substrates in which resin impregnation is more readily and thoroughly accomplished.

The foregoing objects are accomplished in accordance with the invention by maintaining during weaving the cross sectional dimensions or transverse axes of the elliptical, longitudinal glass warp yarns more nearly equal to those dimensions of the elliptical fill yarns. Warp yarns are normally under substantially greater and more constant tension than the orthogonal fill yarns during weaving. This tension and the twist of the yarn cause the multiple filaments composing each yarn to tend to pull in together and form a dense, more nearly cylindrical, compressed bundle. The orthogonal fill yarns extend only across the width of the cloth and tension on them is not maintained. This lack of tension allows the fill yarns to relax and form a looser, more open bundle in which the yarns flatten under the influence of the crossing warp yarns to an elliptical cross section having an extended transverse axis and short conjugate axis.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
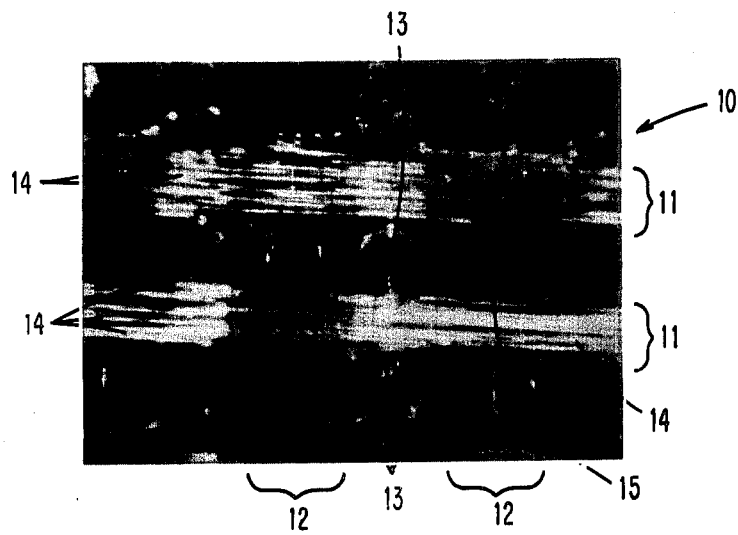
FIG. 1 is a photograph of a magnified portion of a conventional prepreg panel showing the presence of voids among the warp yarns.

In FIG. 1 is shown a photograph of a magnified section 10 of circuit panel prepreg. The prepreg is composed of woven warp yarns 11 and fill or weft yarns 12 each comprised of pluralities of glass filaments. The fabric has been impregnated with a resin such as epoxy resin by passage through a treater and then semi-cured to "B" stage. The fabric woven by yarns 11 and 12 is known commercially as type 280 or 1675 and each yarn includes a plurality of fine unplied, or not wrapped, twisted glass filaments. For example, the yarns in the type 280 each include 408 filaments of a common diameter and the filaments are twisted as a group a predetermined number of turns per unit length, such as three or four turns per inch. After passage through the treater, the impregnated fabric is cut into panels for the semi-curing process. Bubbles 13, seen in FIG. 1, are formed during the semi-curing and disappear when the panels are subjected to final curing. This is done under heat and pressure which again liquifies the resin during the subsequent lamination of the prepreg with other prepreg or metal foil.

Figure 2:
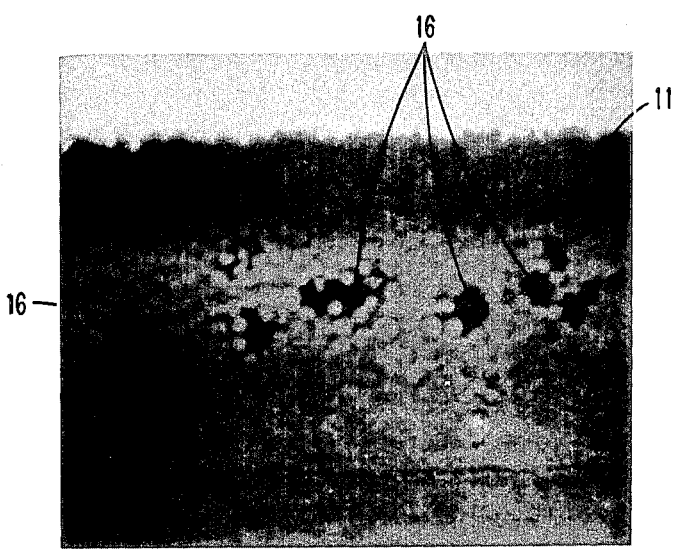
FIG. 2 is a photograph of a magnified cross section of prepreg showing voids within the yarn of the glass fiber fabric.
Figure 3:
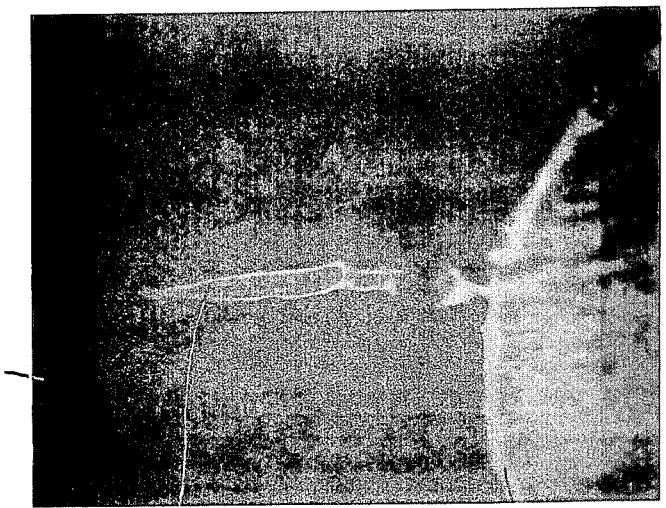
FIG. 3 is an enlargement of a short circuit that developed from a void in a prepreg panel.

In the figure, there appear a plurality of irregular but substantially parallel light areas 14 in warp yarns 11, while such areas occur only infrequently in fill yarns 12. Areas 14 are voids among the glass filaments that are unfilled by liquid resin during passage through the treater. Although many of the voids may be filled by reflow of the resin during final cure, there remain unfilled a substantial number in the warp yarns. When a hole 15 such as that indicated by a dashed line, is drilled through the finally cured cloth and resin, the hole wall exposes voids 16 among the inner filaments within a single warp yarn, as seen in FIG. 2. During the following processing steps of cleaning, seeding and plating the hole walls, various solutions, primarily plating solution, used in these steps become trapped in the voids by the plating deposited on the hole wall. Thereafter, while the panel is in service, the trapped plating solutions, under the influence of voltage differentials, form conductive precipitates on the filament surfaces of the void that create short circuits with other conductors. An example of the growth of a maverick conductive region is seen in FIG. 3. This region 20 extends from the plated hole wall 21 inwardly among the glass fibers toward a voltage supply plane 22.

During the manufacture of the glass cloth, the warp yarns are subjected to tensile stresses in excess of those experienced by the fill yarns. It appears that these stresses on the warp are applied during the weaving process where these longitudinal yarns are maintained taut as the fill yarns are emplaced. Tensile stress can also be applied during the subsequent firing step to clean the filaments of lubricants or other coatings. Stress may be later applied in the treater where the cloth is continuously drawn through the resin bath or applicator.

Because of the tension and the applied filament twisting, the filaments of each warp are urged into a bundle tending toward a more circular cross section, but which is actually an ellipse having a relatively large conjugate axis. This cross section further becomes set during the following cleansing firing. The tight compression of the bundle prevents the resin from thoroughly penetrating and coating the innermost fibers. Although the resin coating, typically epoxy, is a protective and inert composition, impervious to processing materials, the drilling of holes cuts through and exposes the voids.

It has been noted that the voids are much more prevalent in the warp yarns than in the fill yarns. The fill yarns, although composed in the same manner, with the same number of filaments, and of the same dimensions initially as the warp yarns, are not subjected to the same tensile stresses as those imposed on the warp. After being placed, any tensile forces are relaxed allowing the fill yarns to become flattened to an ellipse having a short conjugate axis. This provides a flatter filament bundle that is more easily impregnated with the resin as it flows into the yarn core radially. The surface-to-center distance is much less in the flatter cross section than that of the warp yarn cross section. Accordingly, voids within the fill yarns occur either not at all or at a much lower frequency and with smaller volumes.

An indication of the likelihood of the occurrence of voids and their frequency is the relative lengths of the transverse axes of the ellipse-shaped bundles of the fill and warp filaments, particularly after the cloth has been woven and fired but prior to impregnating. It has been found from commercially available types 280 and 1675 cloth that the length of the transverse axis of the warp yarns can vary from 50 percent to 80 percent of the length of the transverse axis of the fill yarns. The average of the warp yarn transverse axis was approximately 65 percent of that of the fill dimension. A measurement of both yarns can readily be obtained by microscopic examination of the fiber bundles with back lighting.

Figure 4:
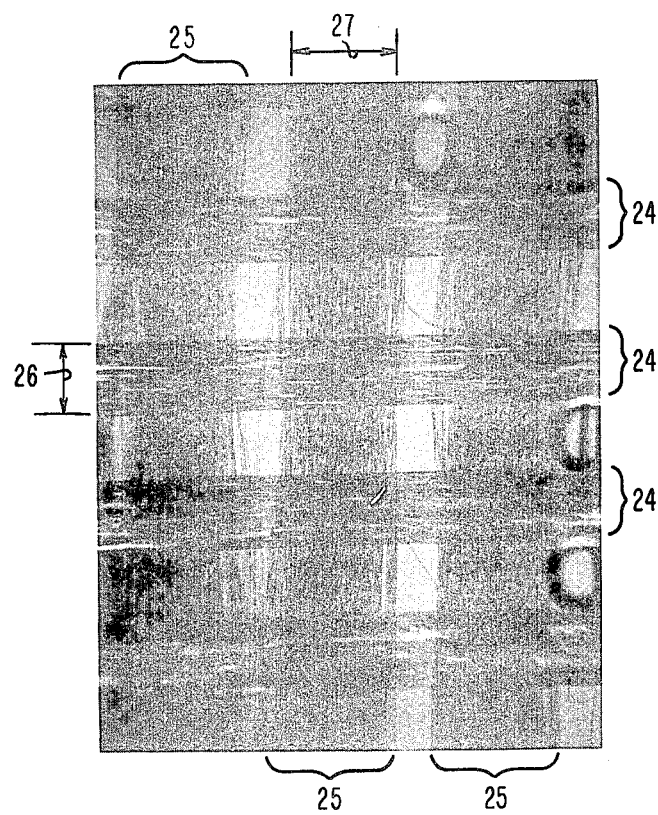
FIG. 4 is a photograph of a magnified prepreg section showing relative widths of warp and fill yarns.

FIG. 4 shows a magnified view of a prepreg sample showing the warp yarns 24 and fill yarns 25. It will be seen that the width 26 of the warp yarns are substantially narrower than width 27 of the orthogonal fill yarns. It should be remembered that both yarns have the same number of filaments.

The number of voids found in the warp after impregnation varies inversely with the decrease in transverse axis ratio. When the ratio is maintained at 75 percent or greater, that is, free filament or similar to the configuration of those in the fill direction, only incidental voids are discovered after resin impregnation. Final curing is effective to insure either the elimination of voids or reduction of their volumes to a point that renders any voids not detrimental. Apparently the initial weaving fixes the yarn dimensions so that subsequent processing has little effect on changing the ratio of the transverse axis. The stress and impregnation in a resin treater of those warp yarns having an initial transverse axis ratio of 75 percent or greater does not further alter the prior ratio.

The foregoing has described a substrate material and its method of manufacture by which the quality of circuit boards can be significantly improved. By maintaining more uniform dimensions of both the warp and fill yarns, a stable and uniform prepreg results and field reliability of the circuit boards is radically increased.

While the invention has been particularly shown and described with reference to a preferred embodiment thereof, it will be understood by those skilled in the art that various changes in form and details may be made therein without departing from the spirit and scope of the invention.

What is claimed:

1. A material for printed circuit substrates comprising a fabric woven from warp and fill yarns of glass filaments with said yarns each having substantially the same number of filaments therein and being substantially elliptical in cross section with the transverse axis of the warp yarn cross sections having a length that is at least 75 percent of the length of the transverse axis of the fill yarn cross sections.

2. Fabric as described in claim 1 further being impregnated with a partially polymerized resin.

3. Structure as described in claim 2 further including at least one circuit line on the surface thereof and said resin being fully polymerized.

4. Structure as described in claim 2 wherein said resin is epoxy resin.

5. A woven fabric comprising warp and fill yarns of substantially equal pluralities of glass filaments with all said yarns having a substantially elliptical cross section and the length of the transverse axis of said warp yarn cross section when woven being at least 75 percent of the length of the transverse axis of said orthogonal fill yarn cross section.

6. Structure as described in claim 5 wherein said fabric is impregnated with a polymerizable resin and has at least one conductive circuit thereon and said resin has been fully polymerized.

* * * * *